(12) United States Patent
Maejima et al.

(10) Patent No.: US 7,875,409 B2
(45) Date of Patent: Jan. 25, 2011

(54) METHOD OF MANUFACTURING SEMICONDUCTOR DEVICE, MASK AND SEMICONDUCTOR DEVICE

(75) Inventors: Shinroku Maejima, Tokyo (JP); Seiichiro Shirai, Tokyo (JP); Takahiro Machida, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 959 days.

(21) Appl. No.: 11/602,505

(22) Filed: Nov. 21, 2006

(65) Prior Publication Data

US 2007/0134564 A1 Jun. 14, 2007

(30) Foreign Application Priority Data

Nov. 22, 2005 (JP) ............................. 2005-337226

(51) Int. Cl.
*G03C 5/00* (2006.01)
*G03F 9/00* (2006.01)
(52) U.S. Cl. ........................... 430/22; 430/30; 430/312; 430/328
(58) Field of Classification Search ................... 430/22, 430/30, 312, 328
See application file for complete search history.

(56) References Cited

U.S. PATENT DOCUMENTS 6,194,105 B1 2/2001 Shacham et al.
6,225,013 B1 5/2001 Cohen et al.

FOREIGN PATENT DOCUMENTS

JP 2-5568 1/1990

*Primary Examiner*—Christopher G Young
(74) *Attorney, Agent, or Firm*—McDermott Will & Emery LLP (57) ABSTRACT

A method of manufacturing a semiconductor device answerable to refinement of circuits by correctly connecting adjacent small patterns with each other with excellent reproducibility in connective exposure and a semiconductor device manufactured by this method are proposed. According to this method of manufacturing a semiconductor device, connective exposure is performed by dividing a pattern formed on a semiconductor substrate into a plurality of patterns and exposing the plurality of divided patterns in a connective manner, by forming marks for adjusting arrangement of the patterns to be connected with each other on the semiconductor substrate before exposing patterns of a semiconductor element and connectively exposing the patterns of the semiconductor element in coincidence with the marks for adjusting arrangement.

9 Claims, 9 Drawing Sheets

METHOD OF MANUFACTURING SEMICONDUCTOR DEVICE, MASK AND SEMICONDUCTOR DEVICE

BACKGROUND OF THE INVENTION

1. Field of the Invention

The present invention relates to a method of manufacturing a semiconductor device by performing connective exposure. The present invention also relates to a mask employed in the method of manufacturing a semiconductor device and a semiconductor device manufactured by this method.

2. Description of the Background Art

Connective exposure is performed in order to manufacture a semiconductor device such as an image sensor having an element size (device size, chip size) larger than the exposable size of an exposer. According to this connective exposure, a large-pattern semiconductor device is manufactured by temporarily dividing a large pattern to be transferred into a plurality of exposable small patterns and exposing the plurality of divided small patterns in a connective manner. A semiconductor device having a plurality of layers can be manufactured by repeating steps of forming single layers by connective exposure.

As a technique of such connective exposure, U.S. Pat. No. 6,194,105, for example, describes a method of dividing a mask into a plurality of mask through a blind while forming opaque trace patterns on the respective masks. A necessary mask is selected from the plurality of divided masks and arranged on a prescribed position for performing exposure. Arrangement of the masks is so adjusted as to align the trace patterns formed on the masks with each other. A large-sized pattern is formed by repeating such movement of the masks and exposure. As to dicing regions, dicing lines are first formed on a wafer for forming patterns to be connected with each other along the dicing lines so that overlap quantities of the patterns can be easily controlled and the patterns can be arranged to have a constant width along the dicing lines by setting the overlap quantities, as described in U.S. Pat. No. 6,225,013.

Japanese Patent Laying-Open No. 02-005568 (1990) describes a wafer stepper type photolithographic manufacturing method forming an array of patterns on a wafer, moving the wafer for performing exposure and repeating such operations until the wafer is entirely covered with the array of patterns. According to this method, alignment marks are exposed on a substrate through photolithography, and alignment patterns are formed in correspondence to the alignment marks. Then, an array of other alignment patterns is formed by alignment through the alignment marks. The aforementioned gazette describes that a large image region can be formed through a conventional wafer stepper according to this method. According to this method utilizing offset printing through photolithography, however, adjacent patterns are not superposed with each other and hence misalignment in printing disadvantageously results in disconnection on junctions between the adjacent patterns.

SUMMARY OF THE INVENTION

Connective exposure is performed by repeating operations of forming a pattern on a substrate by exposure through a mask, thereafter exchanging the mask, moving a stage of an exposer, performing exposure and connecting a new pattern to the previously formed pattern. In such connective exposure, therefore, it is important to correctly connect adjacent patterns with each other with excellent reproducibility, and pattern connection accuracy depends on accuracy for setting the mask on the exposer, stage accuracy of the exposer etc. Under the present circumstances, the patterns are superposed with each other with margins so that circuits are not disconnected on the connected portions of the patterns upon occurrence of an error in connection, leading to a hindrance to refinement etc. of the circuits.

An object of the present invention is to provide a method of manufacturing a semiconductor device answerable to refinement of circuits by correctly connecting adjacent small patterns with each other with excellent reproducibility in connective exposure and a semiconductor device manufactured by this method. Another object of the present invention is to provide a mask useful in such manufacture.

The present invention provides a method of manufacturing a semiconductor device through connective exposure performed by dividing a pattern formed on a semiconductor substrate into a plurality of patterns and exposing the plurality of divided patterns in a connective manner, by forming marks for adjusting arrangement of the patterns to be connected with each other on the semiconductor substrate before exposing patterns of a semiconductor element and connectively exposing the patterns of the semiconductor element in coincidence with the marks for adjusting arrangement.

According to another aspect, the present invention also provides a mask employed in manufacture of a semiconductor device through connective exposure for forming marks for adjusting arrangement of patterns to be connected with each other on a substrate before exposing patterns of a semiconductor element, in which the marks for adjusting arrangement are formed on either an X-dicing region or a Y-dicing region of the substrate. According to still another aspect, the present invention further provides a mask employed for exposing patterns of a semiconductor element to be connected with each other, in which marks for adjusting arrangement of the patterns to be connected with each other are formed on either an X-dicing region or a Y-dicing region of a substrate.

The present invention further provides a semiconductor device having a semiconductor element larger in size than an exposable region of an exposer, in which a mark formed on a substrate for adjusting arrangement of an exposed pattern is arranged on either an X-dicing region or a Y-dicing region.

According to the present invention, patterns can be correctly connected with each other in connective exposure, and circuits can be refined by reducing the quantities of superposition of the patterns. Further, correct connective exposure can be performed with excellent reproducibility in manufacture of an image sensor, an infrared sensor, a large-sized liquid crystal display or the like having a size larger than that of an exposable region of an exposer. The present invention is not restricted to such devices, but is also applicable to a memory, a mass storage device and a logic device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
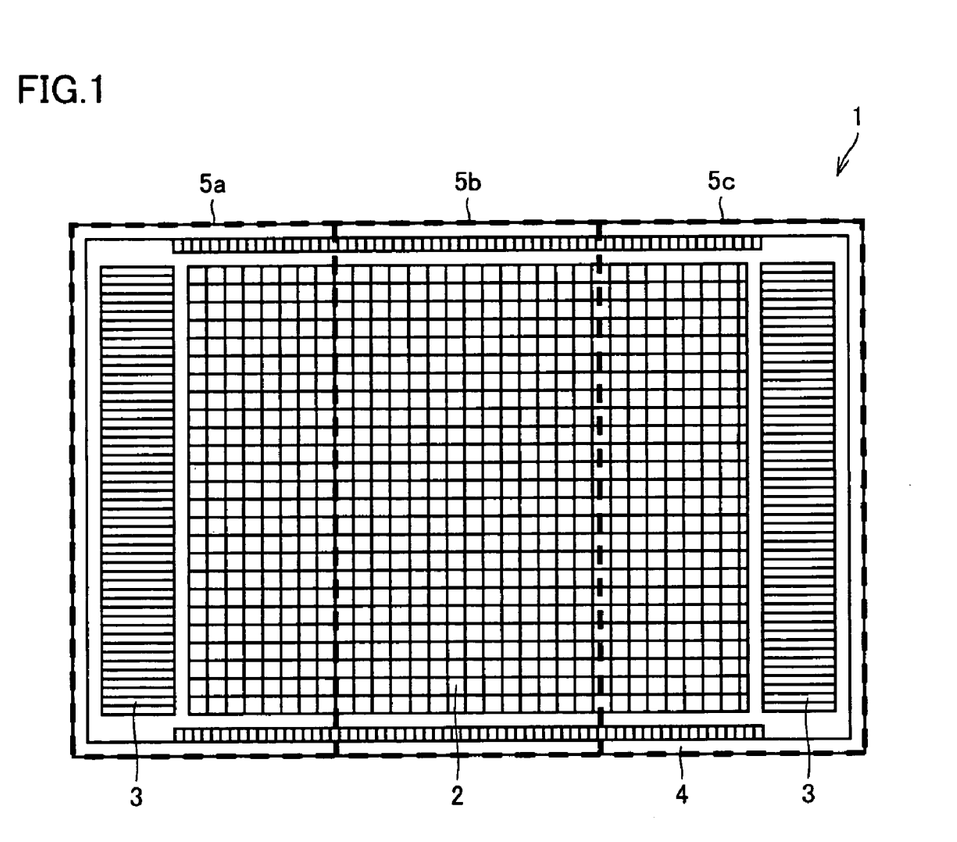
FIG. 1 is a plan view of a semiconductor device having a size larger than that of an exposable region of an exposer.

FIG. 1 is a plan view of a semiconductor device 1 manufactured by connecting three masks with each other. This semiconductor device 1 comprises an element region 2 provided on the center, circuit regions 3 provided on both ends and a dicing region 4 provided on the outer edge. When the size of semiconductor device 1 is large than that of an exposable region of an exposer, a pattern formed on a semiconductor substrate is divided into a plurality of patterns 5a, 5b and 5c in coincidence with the size of the exposable region so that the plurality of divided patterns 5a, 5b and 5c are exposed in a connective manner for manufacturing semiconductor device 1 of a large size. The present invention provides a method of manufacturing a semiconductor device through connective exposure by forming marks (alignment marks and/or superposition inspection marks, for example, hereinafter referred to as "arrangement adjusting marks") for adjusting arrangement of patterns to be connected with each other on a substrate before exposing patterns of a semiconductor element and connectively exposing the patterns of the semiconductor element in coincidence with the marks for adjusting arrangement. The marks for adjusting arrangement are previously formed on the substrate before connectively exposing the patterns of the semiconductor element for performing connective exposure in coincidence with these marks, so that patterns of the semiconductor element subsequent to a first layer can be aligned with each other with reference to the marks for adjusting arrangement, for example. Therefore, the patterns can be so correctly connected with each other that circuits can be refined by reducing the quantities of superposition of the patterns. Further, superposed states of the marks for adjusting arrangement are so measured that the exposer can be previously adjusted on the basis of the measured values.

As a specific mode of the present invention, such a mode that the semiconductor substrate has a first region and a second region adjacent to each other so that marks for adjusting arrangement of the semiconductor element patterns to be connected with each other are formed on the first region and the second region through a first mask, a semiconductor element pattern is thereafter formed by exposing the first region in coincidence with the arrangement adjusting marks through a second mask, another semiconductor element pattern is formed by exposing the second region in coincidence with the arrangement adjusting marks through a third mark and a first connective element pattern is formed by connecting the element pattern of the first region and the element pattern of the second region with each other is preferable, for example.

Further, such a mode that the method has the steps of forming still another semiconductor element pattern by exposing the first region through a fourth mask after forming the first connective element pattern, forming a further semiconductor element pattern by exposing the second region through a fifth mask and forming a second connective element pattern by connecting the element patterns of the first region and the element patterns of the second region with each other while adjusting arrangement of the fourth mask through the element pattern formed through the second mask in the first region and adjusting arrangement of the fifth mask through the element pattern formed through the third mask in the second region is preferable in a point that positional accuracy of the first connective element pattern and the second connective element pattern is improved.

A mode of forming the marks for adjusting arrangement by exposure through a single mask is preferable. In conventional connective exposure, the pattern of a first layer is formed through a plurality of masks and hence array precision of the pattern and marks is deteriorated through set accuracy of the plurality of masks and slide accuracy of a stage. According to the present invention, on the other hand, the marks for adjusting arrangement are so formed through the single mask that array precision is not deteriorated through set accuracy of the unexchanged mask.

A mode of forming the marks for adjusting arrangement by locally exposing a region of a mask to be formed with the marks for adjusting arrangement is preferable. The marks can be formed with stage accuracy of an exposer by repeating operations of locally exposing the portion of the marks for adjusting arrangement, thereafter moving a stage of the exposer and similarly locally exposing an adjacent region. Further, distortion can be reduced for further improving exposure accuracy by exposing a mark forming region of the mask.

Figure 8A:
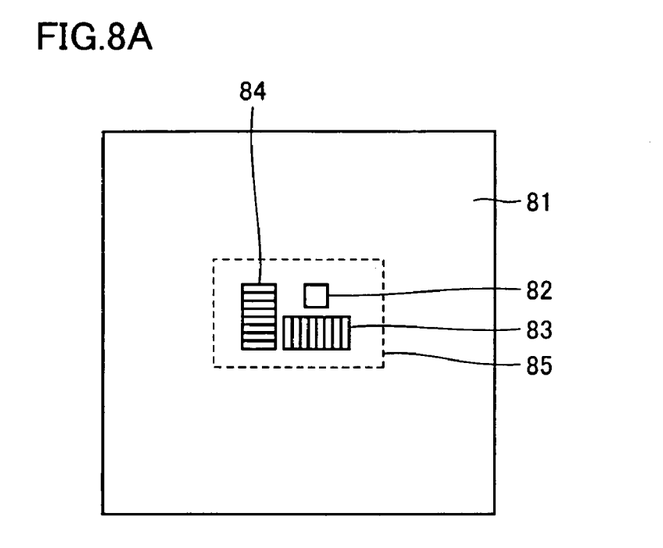
FIGS. 8A and 8B are plan views showing a mask and a semiconductor wafer employed and manufactured in Example 3 of the present invention respectively.
Figure 8B:
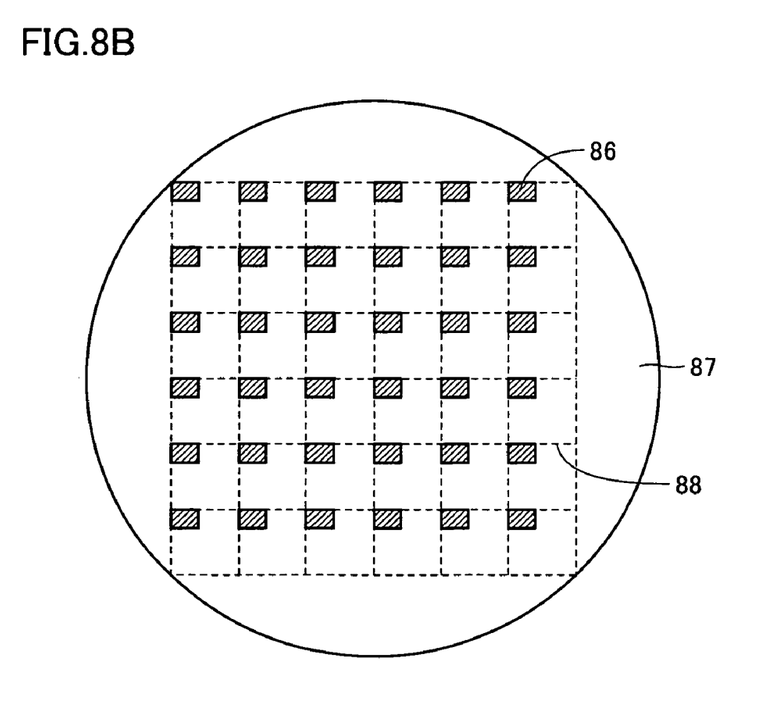

According to this method, a mode of arranging arrangement adjusting marks 86 in an array grid 88 for arranging product chips in a semiconductor wafer 87 can be employed as shown in FIG. 8B, for example. Alternatively, a mode of arranging arrangement adjusting marks 96 on regions out of an array grid 98 in a semiconductor wafer 97 can be employed, as shown in FIG. 9B. According to this mode, the marks can be arrayed through the same mask with slide accuracy of a stage, so that adjacent patterns can be superposed with each other within the range of alignment accuracy and distortion in subsequent steps. Further, high exposure accuracy can be attained by performing exposure while centering the arrangement adjusting marks, while a dicing region can be narrowed, the throughput can be improved and productivity for element chips can be improved particularly according to the latter mode arranging the arrangement adjusting marks on the regions out of the array grid.

A mode of adjusting the positional relation between adjacent marks is preferable in the step of forming the marks for adjusting arrangement. Positional accuracy of marks for adjusting arrangement in a subsequent processing lot can be improved by forming superposition inspection marks for measuring positional relation between adjacent marks on the marks for adjusting arrangement, measuring the positional accuracy through the inspection marks, feeding back measured data to the exposer and adjusting the exposer. Further, superposition accuracy of element patterns of second and subsequent layers can be improved by adjusting arrangement with reference to highly accurate marks. As to superposition of element patterns, therefore, a design allowance can be more reduced as compared with the prior art, for allowing refinement of circuits.

A mode of forming the marks for adjusting arrangement on the semiconductor substrate, performing connective exposure of the pattern of the semiconductor element in coincidence with the marks for adjusting arrangement and thereafter further performing connective exposure in coincidence with the connected pattern is possible. This mode is preferable in a case where positional accuracy of a formed pattern and another pattern further formed on this position is regarded as important. A general manufacturing method and a general design method in a case of performing no connective exposure in a superposition inspection apparatus or an APC (advanced process control) system for correcting a superposition error can be applied. According to the inventive manufacturing method, positional accuracy of the marks for adjusting arrangement formed on the substrate is so high that sufficient positional accuracy can be obtained through simple arrangement on a previously formed pattern.

A mode of forming the marks for adjusting arrangement on either an X-dicing region or a Y-dicing region of the semiconductor substrate is preferable. In general, alignment marks in X- and Y-directions are formed on X- and Y-dicing regions respectively, in order to adjust positions in the X- and Y-directions. If the alignment marks in the X- and Y-directions are similarly formed on the X- and Y-dicing regions respectively also in connective exposure, however, the marks for adjusting arrangement are disadvantageously formed on a pattern region of the semiconductor element connected in a subsequent step. Therefore, the marks for adjusting arrangement are preferably formed on either the X-dicing region or the Y-dicing region of the substrate. In each of the mask employed for forming the marks for adjusting arrangement and a mask employed for forming the semiconductor element patterns to be connected with each other, therefore, the marks for adjusting arrangement are preferably formed on either the X-dicing region or the Y-dicing region of the substrate. A semiconductor device having a semiconductor element larger in size than an exposable region of an exposer and marks for adjusting arrangement formed on either an X-dicing region or a Y-dicing region of a substrate can be manufactured through such masks.

EXAMPLE 1

Figure 10:
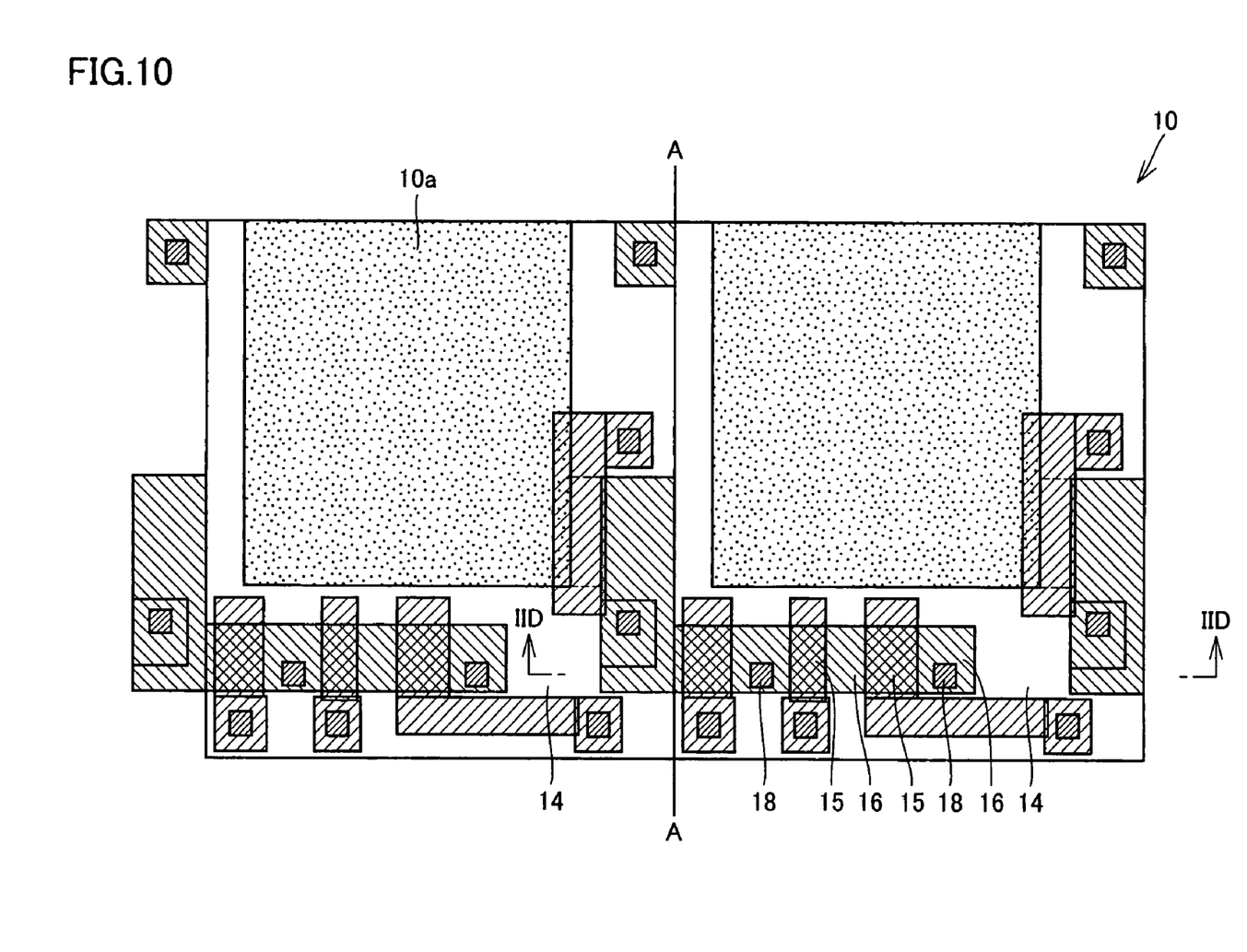
FIG. 10 is a plan view of a MOS device manufactured according to the present invention.

According to Example 1, a MOS (metal oxide semiconductor) device was manufactured through connective exposure. FIG. 10 is a plan view showing the manufactured MOS device 10. FIG. 10 omits illustration of an interlayer dielectric film and wires, in order to clearly illustrate the structure of MOS device 10. This MOS device 10 has a connected portion A-A, and is constituted of photodiodes 10a, gate electrodes 15, impurity regions 16 such as source and drain regions, element isolation regions 14, contacts 18 etc. FIG. 2D is a sectional view taken along the line IID-IID in FIG. 10. As shown in FIG. 2D, a MOS device 20 comprises element isolation regions 24 on a substrate 21, and has gate electrodes 25 and impurity regions 26. An interlayer dielectric film 27 is formed on substrate 21, and contacts 28 are formed between substrate 21 and wires 29 formed on interlayer dielectric film 27.

Figure 2A:
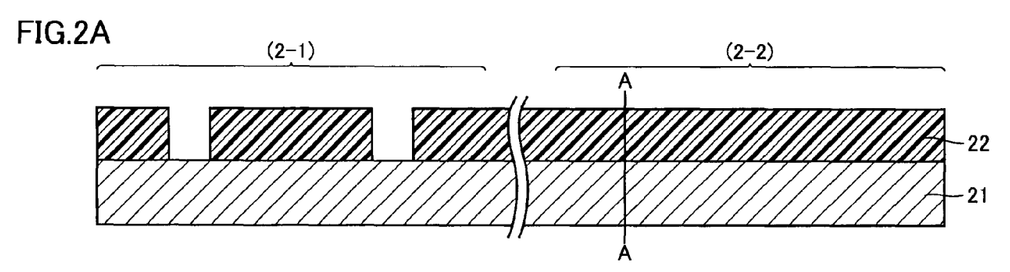
FIGS. 2A to 2D are process drawings showing a method of manufacturing a MOS device according to the present invention.
Figure 2B:
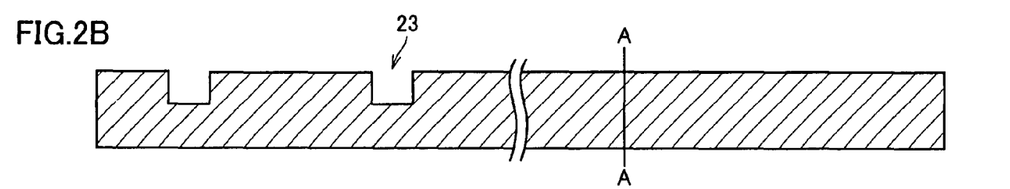
Figure 2C:
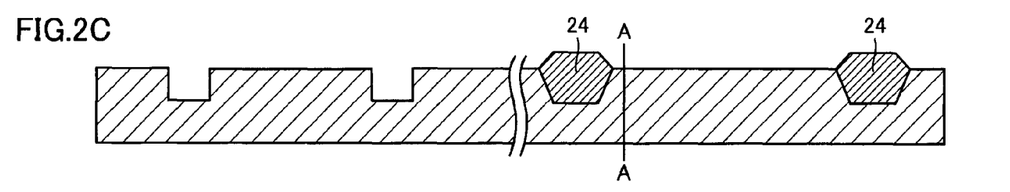
Figure 2D:
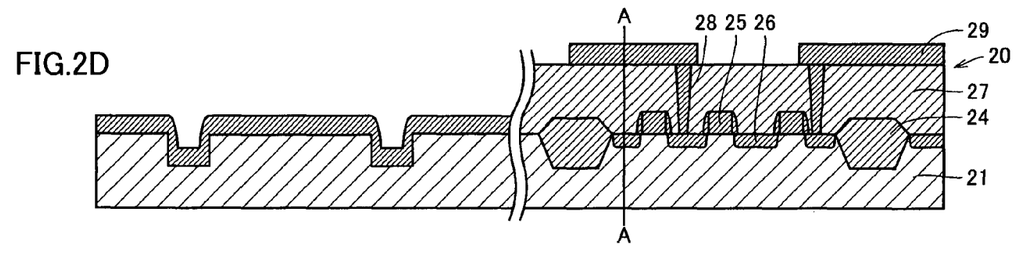

FIGS. 2A to 2D show a method of manufacturing MOS device 20. Referring to each of FIGS. 2A to 2D, symbol A-A denotes a connected portion, and reference numerals (2-1) and (2-2) show a step of manufacturing marks for adjusting arrangement and a step of manufacturing a semiconductor element region respectively. First, a resist film 22 was formed on p-type semiconductor substrate 21 and patterned by exposure and development through a mask, in order to form arrangement adjusting marks 23 (FIG. 2A). Then, arrangement adjusting marks 23 were formed by etching (FIG. 2B), an $SiO_2$ film was formed by oxidation, and an $Si_3N_4$ film was formed on the $SiO_2$ film by LPCVD. Then, another resist film was formed and element isolation regions were connectively exposed, developed and patterned while adjusting arrangement of masks through arrangement adjusting marks 23. Thereafter the $Si_3N_4$ film was selectively removed by etching, and element isolation regions 24 of $SiO_2$ were formed through field oxidation by heat treatment at a temperature of 1000° C. for 150 minutes (FIG. 2C). Then, the $Si_3N_4$ film was separated, and MOS device 20 was manufactured by depositing polysilicon, forming gate electrodes 25, thereafter forming impurity regions 26 and further forming interlayer dielectric film 27, contacts 28 and wires 29 (FIG. 2D).

Figure 3:
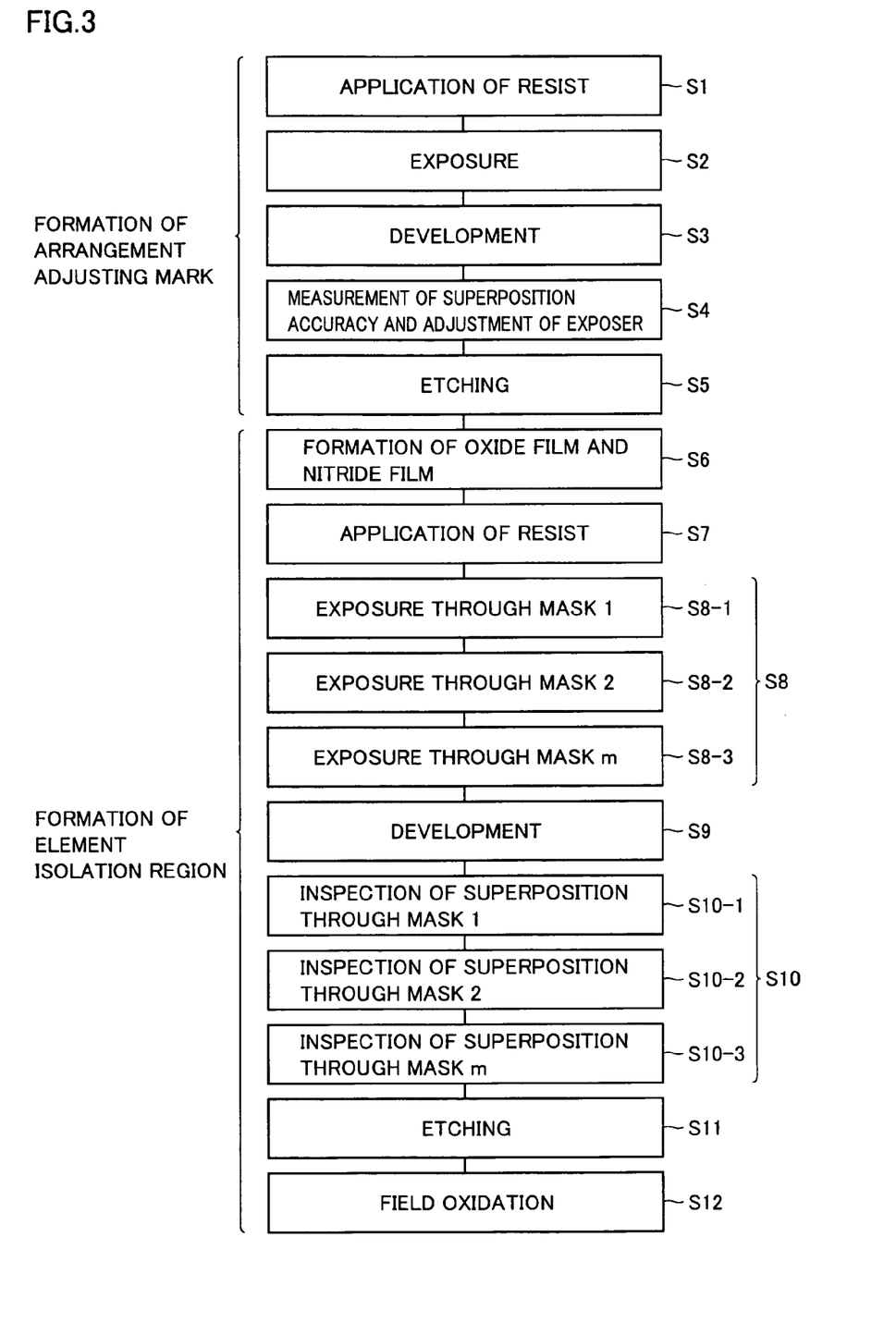
FIG. 3 is a flow chart as to formation of arrangement adjusting marks and element isolation regions in the method of manufacturing a MOS device according to the present invention.

FIG. 3 is a flow chart as to formation of the arrangement adjusting marks and the element isolation regions. The arrangement adjusting marks were formed on the substrate before exposing patterns of the isolation regions in a semiconductor element, as shown in FIG. 3. First, resist was applied onto the substrate (step 1) (steps 2 to 12 are hereinafter referred to as S2 to S12), exposed (S2) and thereafter developed (S3). Then, pattern superposition accuracy was measured (S4), and the substrate was etched when the accuracy was within a prescribed standard (S5). The measured value was fed back for adjusting the exposer for correctly superposing portions to be connected with each other in a subsequent processing lot (S4). If the measured value of the superposition accuracy is out of the prescribed standard, the resist is removed and another resist is applied for feeding back the aforementioned measured value and performing exposure.

Figure 4:
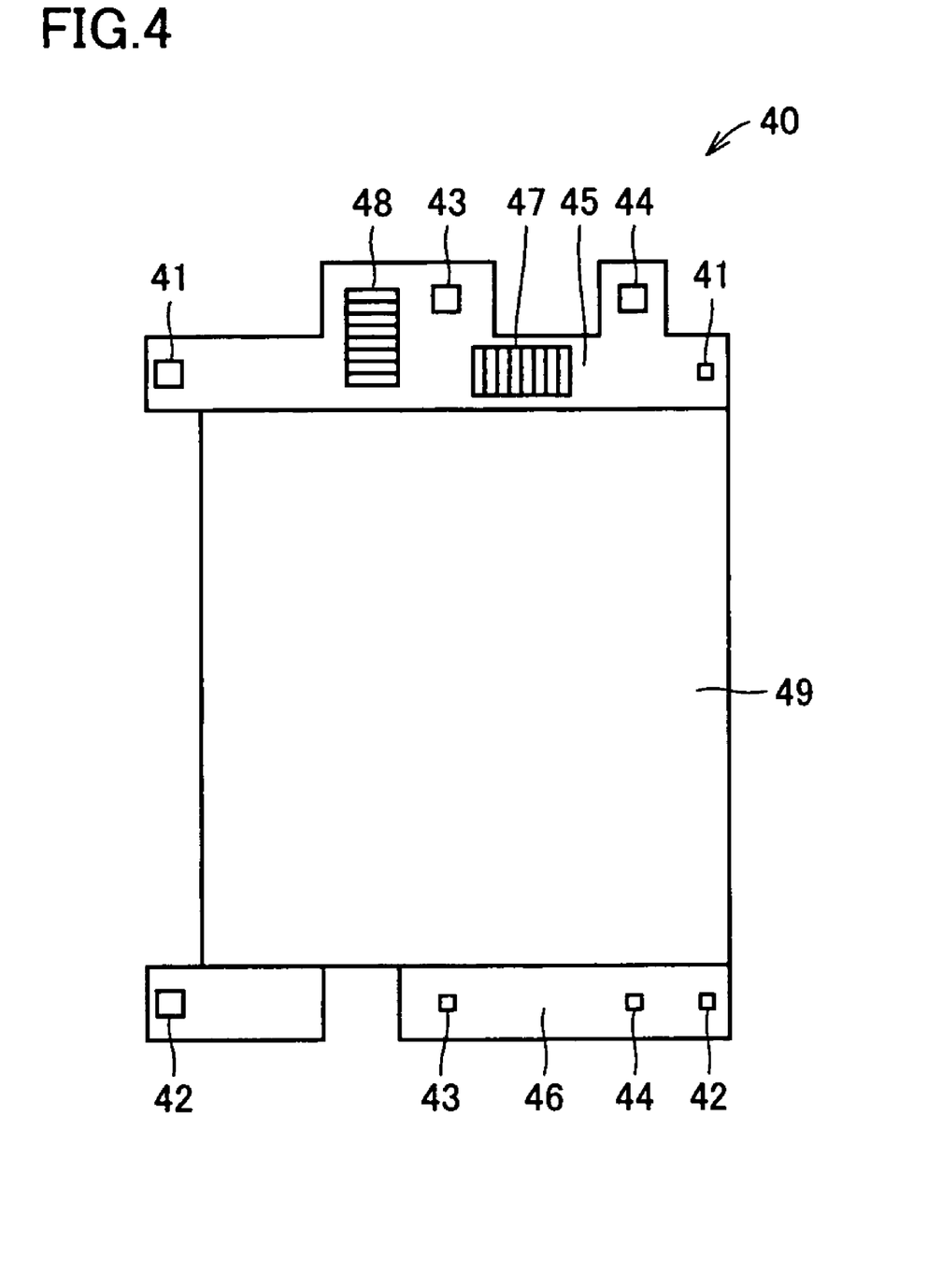
FIG. 4 is a plan view of a mask employed for forming arrangement adjusting marks in Example 1 of the present invention.

The exposure (S2) was performed through a single mask 40 shown in FIG. 4, and connective exposure was performed by moving a stage of the exposer and arranging the substrate. According to Example 1, the arrangement adjusting marks were formed through this single pattern mask 40. Therefore, mask 40 was not exchanged and it was possible to suppress accuracy deterioration resulting from set accuracy of mask 40. Mask 40 comprised a pattern region 49 for forming a pattern of a semiconductor element and X-dicing regions 45 and 46 with superposition inspection patterns 41 to 44, an X-directional alignment pattern 47 and a Y-directional alignment pattern 48 provided on X-dicing regions 45 and 46. The arrangement adjusting marks were formed only on X-dicing regions 45 and 46 through this mask 40. Therefore, no marks for adjusting arrangement were formed on a pattern region for a semiconductor element connected in a subsequent step.

Figure 5:
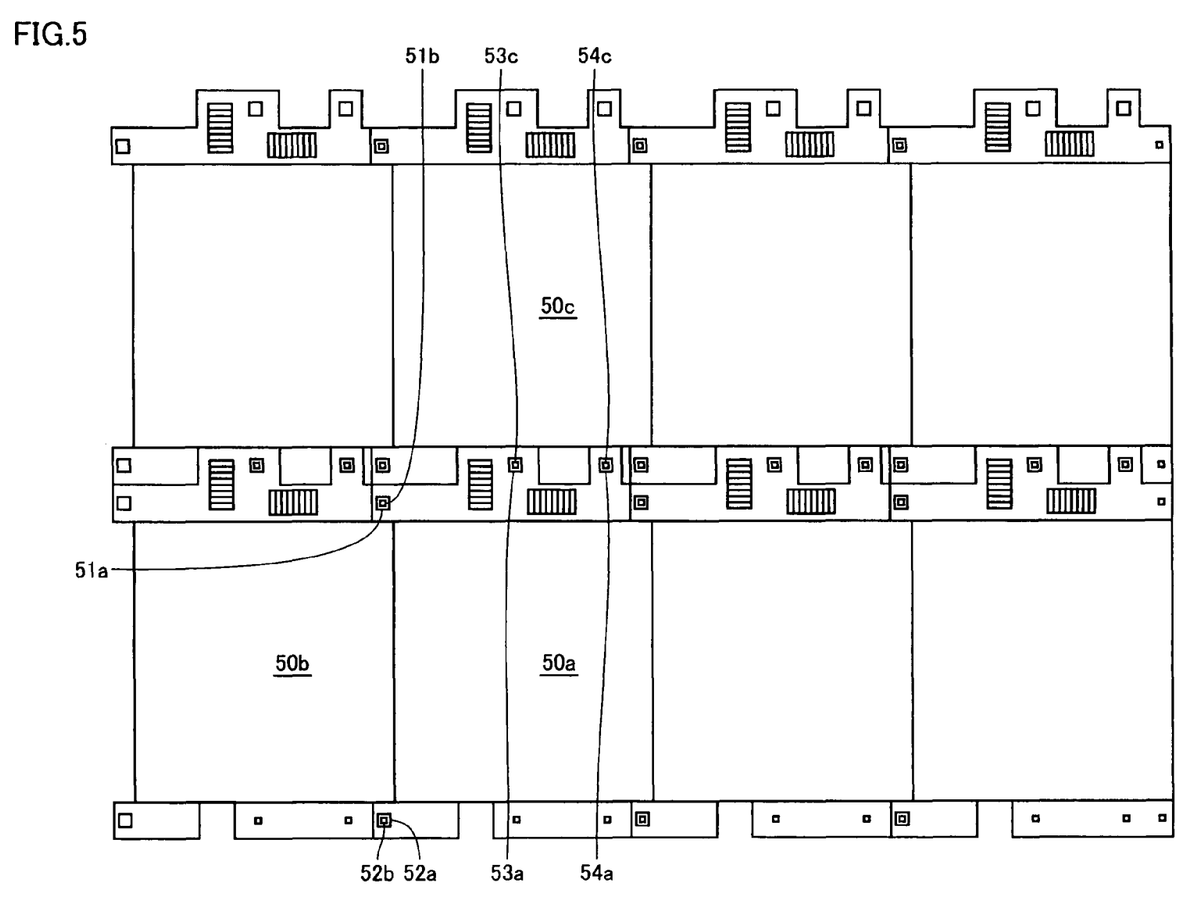
FIG. 5 is a plan view showing arrangement of masks employed for forming the arrangement adjusting marks in Example 1 of the present invention.

FIG. 5 is a plan view showing arrangement of masks employed for forming the arrangement adjusting marks. According to Example 1, single masks were employed and connective exposure was performed by moving the stage of the exposer to superpose adjacent masks with each other, as shown in FIG. 5. Adjacent patterns were so arranged that a superposition inspection pattern 51a for a pattern 50a coincided with a superposition inspection pattern 51b for a leftwardly adjacent pattern 50b, for example, as shown in FIG. 5. Superposition inspection pattern 51a was rendered larger than superposition inspection pattern 51b. Superposition accuracy was measured by measuring misalignment of inner superposition inspection pattern 51b with respect to outer superposition inspection pattern 51a. Similarly, another superposition inspection pattern 52a for pattern 50a was arranged to coincide with another superposition inspection pattern 52b for leftwardly adjacent pattern 50b, for similarly measuring misalignment. In addition, still another superposition inspection pattern 53a for pattern 50a was arranged to coincide with a superposition inspection pattern 53c for a pattern 50c adjacent on the other side while a superposition inspection pattern 54a was arranged to coincide with a superposition inspection pattern 54c, for similarly measuring misalignment. Misalignment of the remaining patterns was also measured. According to Example 1, the results of measurement were fed back to the exposer and adjusted after the measurement of superposition accuracy, whereby positional accuracy of the arrangement adjusting marks was improved also as to subsequent lots so that arrangement accuracy of element patterns arranged with reference to the arrangement adjusting marks was continuously improved and maintained also between different lots.

The element isolation regions were formed after forming the arrangement adjusting marks. First, as shown in FIG. 3, an oxide film and a nitride film were formed on the substrate (S6), thereafter resist was applied (S7), and the patterns of the element isolation regions were exposed as the patterns of the semiconductor element (S8). After the exposure, development was performed (S9), superposition was inspected (S10), the nitride film was etched (S11) and field oxidation was performed (S12) for forming the element isolation regions, as shown in FIG. 3. The semiconductor element patterns were exposed (S8) by moving the stage in coincidence with a first alignment mark formed on the substrate as the arrangement adjusting mark, exposing the mark through a mask 1 (S8-1), moving the stage in coincidence with a next alignment mark and exposing the mark through a mask 2 (S8-2) and repeating such operations up to a mask m thereby performing connective exposure (S8-3). Superposition was inspected (S10) between an inspection pattern formed through mask 1 and an inspection pattern on the substrate (S10-1) and inspected between an inspection pattern formed through mask 2 and the inspection pattern on the substrate (S10-2), while such operations were repeated up to the mask m.

Figures 6, 7:
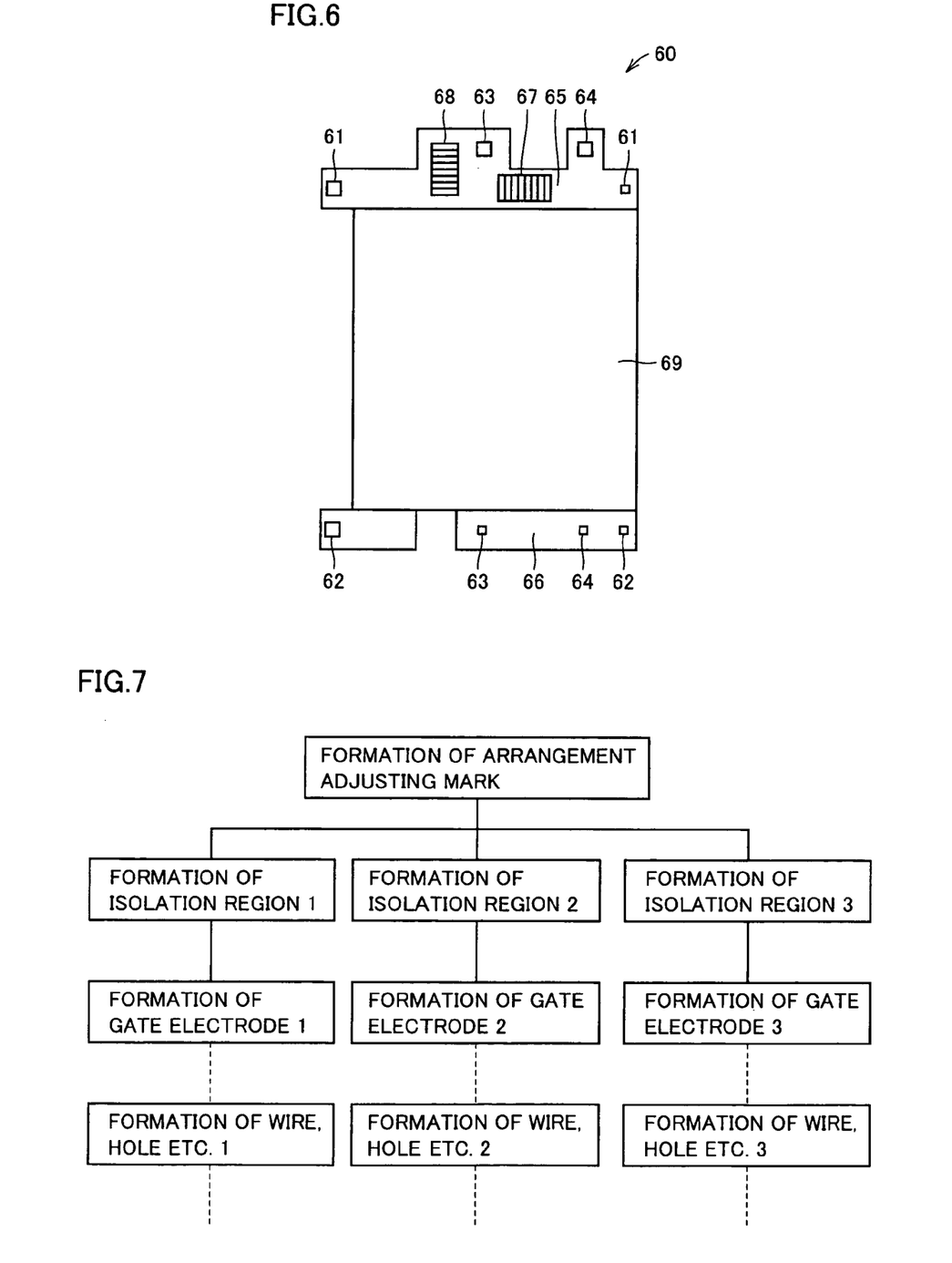
FIG. 6 is a plan view of a mask employed for forming an element pattern in Example 1 of the present invention.
FIG. 7 is an alignment tree in Example 2 of the present invention.

The patterns of the semiconductor element were exposed (S8) through a pattern mask 60 shown in FIG. 6, and the substrate was arranged by adjusting the position of the stage of the exposer for performing connective exposure. Mask 60 comprised a semiconductor element pattern region 69 and X-dicing regions 65 and 66 with superposition inspection patterns 61 to 64, an X-directional alignment pattern 67 and a Y-directional alignment pattern 68 provided on X-dicing regions 65 and 66. Arrangement adjusting marks were formed only on the X-dicing regions 65 and 66 through this mask 60. Therefore, no arrangement adjusting marks were formed on a circuit region of a pattern connected in a subsequent step. In a semiconductor device as obtained, the size of the semiconductor element was larger than that of an exposable region of the exposer, and the arrangement adjusting marks were arranged only on the X-dicing regions.

EXAMPLE 2

According to Example 2, a MOS device was manufactured similarly to Example 1 except that gate electrodes were formed by further performing connective exposure in coincidence with the patterns of element isolation regions formed by connective exposure after the connective exposure of the element isolation regions. FIG. 7 is an alignment tree of Example 2. As shown in FIG. 7, marks for adjusting arrangement of respective patterns of the element isolation regions were formed on a substrate, for forming element isolation regions 1 to 3 by performing connective exposure in coincidence with the marks for adjusting arrangement. Then, gate electrodes 1 to 3 were formed by connective exposure through alignment with the patterns of element isolation regions 1 to 3, for manufacturing the MOS device.

In the manufactured MOS device, positional accuracy of gate electrodes 1 to 3 with respect to element isolation regions 1 to 3 was so high that a high-characteristic MOS device was obtained since superposition accuracy between patterns of element isolation regions and patterns of gate electrodes is regarded as important in a MOS device. Further, positional accuracy of the arrangement adjusting marks formed on the substrate was so high that sufficient positional accuracy was attained by simply adjusting arrangement with respect to previously formed patterns without adjusting the arrangement between right and left patterns. Therefore, it was possible to reduce the processing time for superposition inspection. Further, a general manufacturing method and a general design method in a case of performing no connective exposure in a superposition inspection apparatus or an APC (advanced process control) system for correcting a superposition error, applied to the gate electrodes in Example 2, can also be applied to wire patterns or hole patterns of a higher layer as shown in FIG. 7. In particular, it was possible to accurately connect wires 29 on the connected portion as shown in FIG. 2D.

EXAMPLE 3

When forming arrangement adjusting marks on a substrate according to Example 3, a region 85 of arrangement adjusting marks including a superposition inspection mark 82, an X-directional alignment mark 83 and a Y-directional alignment mark 84 was locally exposed in a mask 81 as shown in FIG. 8A. In this exposure, mask 81 was set on an exposer to center region 85. After the exposure, a wafer stage of the exposer was moved so that exposure and movement of the stage were repeated for thereafter performing development and etching. Consequently, as shown in FIG. 8B, a semiconductor wafer 87 having arrangement adjusting marks 86 arranged in an array grid 88 for arraying product chips was obtained for manufacturing the MOS device similarly to Example 1.

According to Example 3, the same mask was employed for forming the arrangement adjusting marks by sliding the wafer stage, whereby it was possible to perform patterning within the range of slide accuracy with no error resulting from mask arrangement as compared with a mode of employing a plurality of masks and arranging the masks every exposure. Consequently, it was possible to superpose adjacent patterns within the range of alignment accuracy and distortion in subsequent steps. According to the mode of Example 3, it was possible to set and expose the mask to center the region for forming the arrangement adjusting marks, whereby distortion was reduced as compared with a case where regions for forming arrangement adjusting marks were provided around an exposed region and it was possible to further improve exposure accuracy.

EXAMPLE 4

Figure 9A:
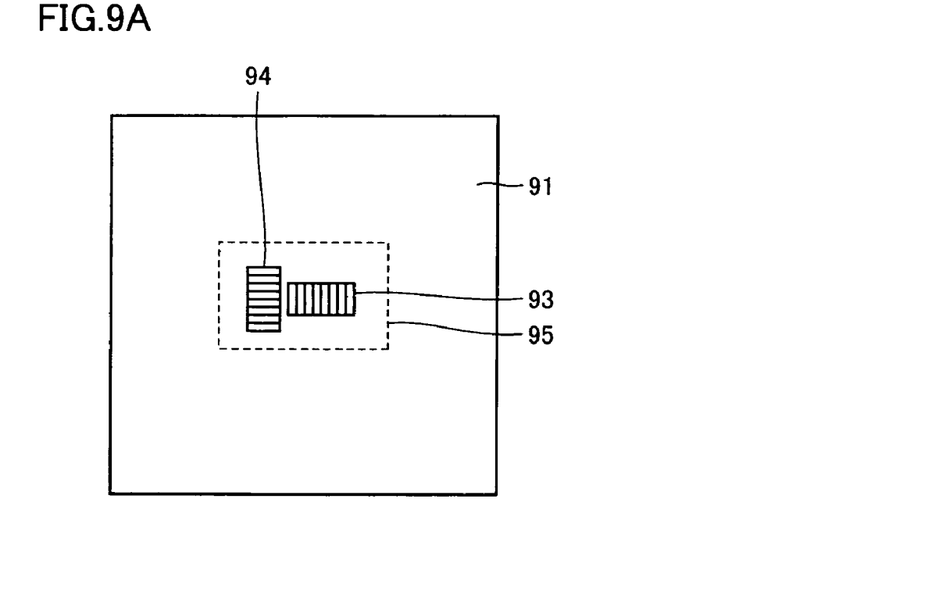
FIGS. 9A and 9B are plan views showing a mask and a semiconductor wafer employed and manufactured in Example 4 of the present invention respectively.
Figure 9B:
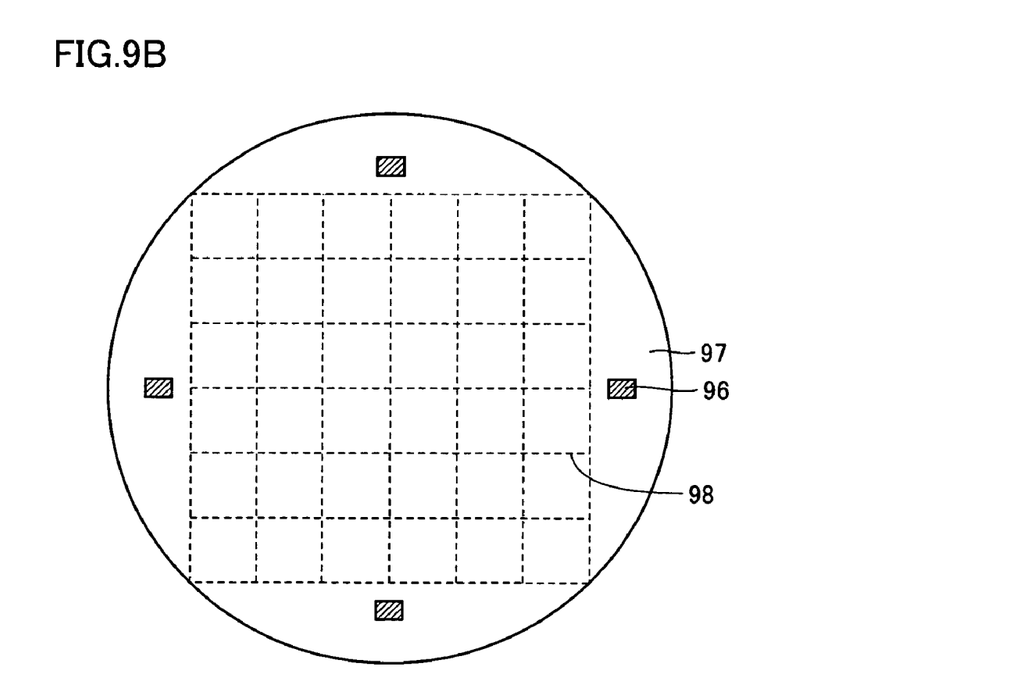

When forming marks for adjusting arrangement on a substrate according to Example 4, a region 95 for forming arrangement adjusting marks including an X-directional alignment mark 93 and a Y-directional alignment mark 94 in a mask 91 was locally exposed as shown in FIG. 9A. In this exposure, mask 91 was set on an exposer to center region 95 on an exposure region. After the exposure a wafer stage of the exposer was moved so that exposure and movement of the stage were repeated for thereafter performing development and etching. Consequently, as shown in FIG. 9B, a semiconductor wafer 97 having arrangement adjusting marks 96 arranged on regions out of an array grid 98 for arraying product chips was obtained for manufacturing the MOS device similarly to Example 1.

According to Example 4, the same mask was employed for forming the arrangement adjusting marks by sliding the wafer stage, whereby it was possible to perform patterning within the range of slide accuracy similarly to Example 3. Consequently, it was possible to superpose adjacent patterns with each other within the range of alignment accuracy, distortion and array accuracy in subsequent steps. Further, it was possible to set and expose the mask to center the region for forming the arrangement adjusting marks on the exposure region, whereby distortion was reduced as compared with a case where arrangement adjusting marks were provided around an exposed region and it was possible to further improve exposure accuracy. In addition, arrangement adjusting marks 96 were arranged on the regions out of array grid 98 for arraying the product chips, whereby it was possible to reduce the size of dicing regions, improve the throughput and increase manufacturing efficiency for the semiconductor device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device through connective exposure, the method comprising:
    dividing a pattern of a semiconductor element into a plurality of patterns, the pattern being formed on a semiconductor substrate; and
    exposing said plurality of divided patterns in a connective manner onto the semiconductor substrate, wherein
    the exposing said plurality of divided patterns includes
        forming marks on said semiconductor substrate before exposing the plurality of divided patterns of the semiconductor element by exposure through a single mask, said marks being for adjusting arrangement of said plurality of divided patterns to be connected and being formed by exposure through a single mask, said marks including at least one mark different in size from the other marks, and
    connectively exposing said plurality of divided patterns of said semiconductor element in coincidence with said marks for adjusting arrangement of the plurality of divided patterns.

2. The method of manufacturing a semiconductor device according to claim 1, wherein
    said semiconductor substrate has a first region and a second region adjacent to each other,
    said method having the steps of:
        forming said marks for adjusting arrangement of said plurality of divided patterns to be connected with each other on said first region and said second region by exposing through the single mask,
        thereafter forming a semiconductor element pattern on said first region by exposing through a first mask in coincidence with said marks for adjusting arrangement,
        forming another semiconductor element pattern on said second region by exposing through a second mask in coincidence with said marks for adjusting arrangement, and
        forming a first connective element pattern by connecting the element pattern of said first region and the element pattern of said second region with each other.

3. The method of manufacturing a semiconductor device according to claim 2, further having the steps of:
    forming still another semiconductor element pattern on said first region by exposing through a third mask after forming said first connective element pattern,
    forming a further semiconductor element pattern on said second region by exposing through a fourth mask, and
    forming a second connective element pattern by connecting said element patterns of said first region and said element patterns of said second region with each other,
    while adjusting arrangement of said third mask through the element pattern formed through said first mask in said first region, and
    adjusting arrangement of said fourth mask through the element pattern formed through said second mask in said second region.

4. The method of manufacturing a semiconductor device according to claim 1, adjusting the positional relation between adjacent marks in the step of forming said marks for adjusting arrangement.

5. The method of manufacturing a semiconductor device according to claim 1, further performing connective exposure in coincidence with arrangement of said patterns connected with each other after connective exposure of said patterns of said semiconductor element.

6. The method of manufacturing a semiconductor device according to claim 1, forming said marks for adjusting arrangement on either an X-dicing region or a Y-dicing region of said semiconductor substrate.

7. The method of manufacturing a semiconductor device according to claim 1, forming said marks for adjusting arrangement by locally exposing a region of a mark to be formed with said marks for adjusting arrangement.

8. The method of manufacturing a semiconductor device according to claim 1, arranging said marks for adjusting arrangement in an array grid for arraying product chips in a semiconductor wafer.

9. The method of manufacturing a semiconductor device according to claim 1, arranging said marks for adjusting arrangement on a region out of an array grid in a semiconductor wafer.

* * * * *